US006411112B1

United States Patent
Das et al.

(10) Patent No.: US 6,411,112 B1
(45) Date of Patent: *Jun. 25, 2002

(54) OFF-AXIS CONTACT TIP AND DENSE PACKING DESIGN FOR A FINE PITCH PROBE

(75) Inventors: Gobinda Das, Hopewell Junction, NY (US); Steven J. Duda, Underhill Center, VT (US); Paul M. Gaschke, Wappingers Falls, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 34 days.

(21) Appl. No.: 09/026,382

(22) Filed: Feb. 19, 1998

(51) Int. Cl.[7] .............................................. G01R 31/02
(52) U.S. Cl. ....................................... 324/754; 324/761
(58) Field of Search ................................ 324/754, 761, 324/756

(56) References Cited

U.S. PATENT DOCUMENTS

| | | | | |
|---|---|---|---|---|
| 3,617,145 A | * | 11/1971 | Celmer et al. ............... | 408/204 |
| 3,806,801 A | | 4/1974 | Bove .......................... | 324/761 |
| 3,970,934 A | | 7/1976 | Aksu .......................... | 324/754 |
| 3,992,073 A | | 11/1976 | Buchoff et al. ............. | 324/72.5 |
| 4,027,935 A | | 6/1977 | Byrnes et al. ............... | 439/289 |
| 4,554,506 A | * | 11/1985 | Faure et al. ................. | 324/761 |
| 4,622,514 A | | 11/1986 | Lewis ......................... | 324/761 |
| 4,675,600 A | | 6/1987 | Gergin ........................ | 324/754 |
| 4,816,754 A | | 3/1989 | Buechele et al. ........... | 324/761 |
| 4,843,315 A | | 6/1989 | Bayer et al. ................. | 324/756 |
| 4,871,964 A | | 10/1989 | Boll et al. ................... | 324/754 |
| 4,897,043 A | * | 1/1990 | Giringer et al. ............. | 439/482 |
| 4,901,013 A | * | 2/1990 | Benedetto et al. .......... | 324/761 |
| 4,963,822 A | * | 10/1990 | Prokopp ...................... | 324/758 |
| 5,032,787 A | | 7/1991 | Johnston et al. ............. | 324/761 |
| 5,122,070 A | | 6/1992 | Lebris et al. ................ | 324/761 |
| 5,225,777 A | | 7/1993 | Bross et al. ................. | 324/754 |
| 5,367,254 A | | 11/1994 | Faure et al. ................. | 324/754 |
| 5,385,477 A | * | 1/1995 | Vaynkof et al. ............. | 439/66 |
| 5,457,392 A | | 10/1995 | Filipescu .................... | 324/757 |
| 5,488,314 A | * | 1/1996 | Brandt et al. ............... | 324/758 |
| 5,507,652 A | * | 4/1996 | Wardwell .................... | 324/754 |
| 5,565,767 A | * | 10/1996 | Yoshimizu et al. ......... | 324/158.1 |
| 5,731,710 A | * | 3/1998 | Mizuno et al. .............. | 324/761 |
| 5,923,178 A | * | 7/1999 | Higgins et al. .............. | 324/754 |

FOREIGN PATENT DOCUMENTS

RU    445178    9/1974

OTHER PUBLICATIONS

Multilayer Printed–Circuit Boards, R. Cechanek, IBM Technical Disclosure Bulletin, vol. 20, No. 11B, Apr. 1978.

* cited by examiner

*Primary Examiner*—Vinh P. Nguyen
*Assistant Examiner*—Jermele M. Hollington
(74) *Attorney, Agent, or Firm*—James A. Lucas; Driggs, Lucas, Brubaker & Hogg Co., LPA

(57) ABSTRACT

A probe system for electrical contact testing of a row of densely spaced wire bonding pads is provided comprising a plurality of probes, with each probe having a tip offset from the probe center axis. The probes may be mounted in a housing having an upper die and a lower die, and the lower die may be offset from the upper die. The probes are pivotally mounted in the holes of the upper die, and the probe bodies are convexly curved and extend down into the holes of the lower die. The bevel tipped probes may be arranged in two staggered and parallel rows of probes, with the tip of each probe oriented along the centerline formed between the two row of probes. The probes may be closely spaced in each row. The tips of the probes in one row are oriented 180 degrees with respect to the probes in the opposite row. The tips of each probe may also comprise a tip located along the center axis or a double bevel surface forming a tip at the apex of the two bevel surfaces.

14 Claims, 6 Drawing Sheets

OFF-AXIS CONTACT TIP AND DENSE PACKING DESIGN FOR A FINE PITCH PROBE

FIELD OF THE INVENTION

The present invention pertains generally to an arrangement of contacting elements or contacts assembled into a probe for electrically connecting a test system to the contact pads on a semiconductor device to be tested. More specifically, the invention relates to test probes for contacting rows of densely spaced bonding pads such as on memory devices on a wafer.

BACKGROUND OF THE INVENTION

A large portion of the silicon chip industry utilize cantilevered beam probes to make electrical contact to the devices on a wafer. Cantilevered beam probes make electrical contact to pads typically made of aluminum, which are usually located on the perimeter of a device or arranged in a single or double row in the center of a device. Generally, cantilevered beam probes are capable of contacting pads that have a center-to-center spacing or pitch as low as 75 microns. However, one important disadvantage of cantilever beam probes is they cannot be used to contact more than a double row of pads since the beams would interfere with each other. This problem also limits cantilever probes for testing more than one chip at a time.

Vertical probes are typically utilized to overcome the disadvantages of cantilever probes because the probes do not interfere with each other. A typical vertical probe is the Cobra probe which is described in U.S. Pat. No. 4,027,935. This probe consists of an upper and lower die which supports the contacts that are formed from a 125 micron diameter wire. The contacts are generally sharpened to a fine point on the center axis of the wire, like a pencil point. This tip shape both improves the ability to penetrate aluminum oxide on the device pad and has the relative effect of enlarging the pad size. In other words, the fine tip makes it easier to hit the pad within the allowable window. The larger the tip, the more likely it is to contact the area outside of, or miss the targeted window. Currently, 125 micron vertical probes are capable of contacting an array of pads on a 225 micron pitch. In order to be able to contact pads with a smaller pitch, thinner wire on the order of a 100 microns or less can be used to form the contacts, but has the disadvantage of less strength and more difficult handling. Furthermore, thinner wire increases the tendency of the contacts to fail mechanically. Thus an improved probe is needed to overcome these and other disadvantages of the prior art, and is provided by this invention.

SUMMARY OF THE INVENTION

The present invention overcomes these and other disadvantages of the prior art, by providing in one aspect a probe system comprising a plurality of probes having a center axis, with each probe having a tip offset from the probe axis. The offset tips of the probes are arranged in two parallel rows for contacting a row of pads with the tip of each probe oriented adjacent the centerline between the two rows of probes.

In accordance with another aspect of the invention, a probe system for contacting a row of pads is provided comprising a housing having an upper die, a lower die, and a plurality of probes having a center axis. Each probe has a tip for contacting a pad. Each probe has a first end pivotally mounted in a hole of the upper die and a distal end extending down from the upper die into a hole of the lower die. The lower die holes with the probe tips mounted therein are arranged in two parallel rows with each probe tip oriented on the centerline formed between the two rows of probe tips.

In accordance with another aspect of the invention, a probe system for contacting a row of pads is provided comprising a housing having an upper die, a lower die and a plurality of probes each having a center axis. Each probe has a distal end having a tip for contacting a pad. Each probe has a first end pivotally mounted in a hole of an upper die and a distal end extending down from the upper die and into a hole of the lower die. The upper die holes are arranged in two parallel rows in a staggered configuration. The lower die holes with the probe tips mounted therein are arranged in two parallel rows with each probe tip oriented on the centerline between the two rows of probe tips.

In accordance with yet another aspect of the invention, a probe for contacting a pad is provided comprising a probe having a center axis and a second end. The second end has a bevel to provide a tip offset from the center axis and is located along the probe periphery.

In accordance with still another aspect of the invention, a probe for contacting a pad comprising a probe having a center axis and a second end. The second end has a first and second bevel to provide a tip at the apex of the intersection of the first and second bevels. The tip is offset from the center axis and is located along the probe periphery.

DETAILED DESCRIPTION OF THE FIGURES

Figure 5A:
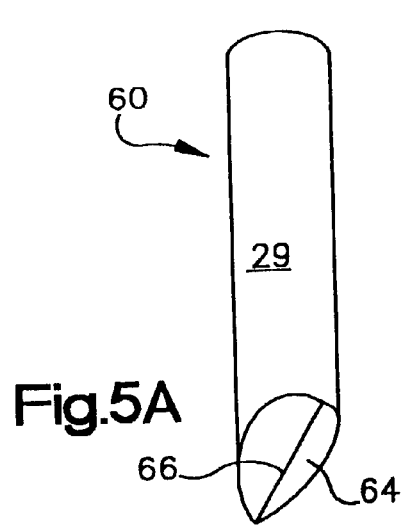
Figure 6:
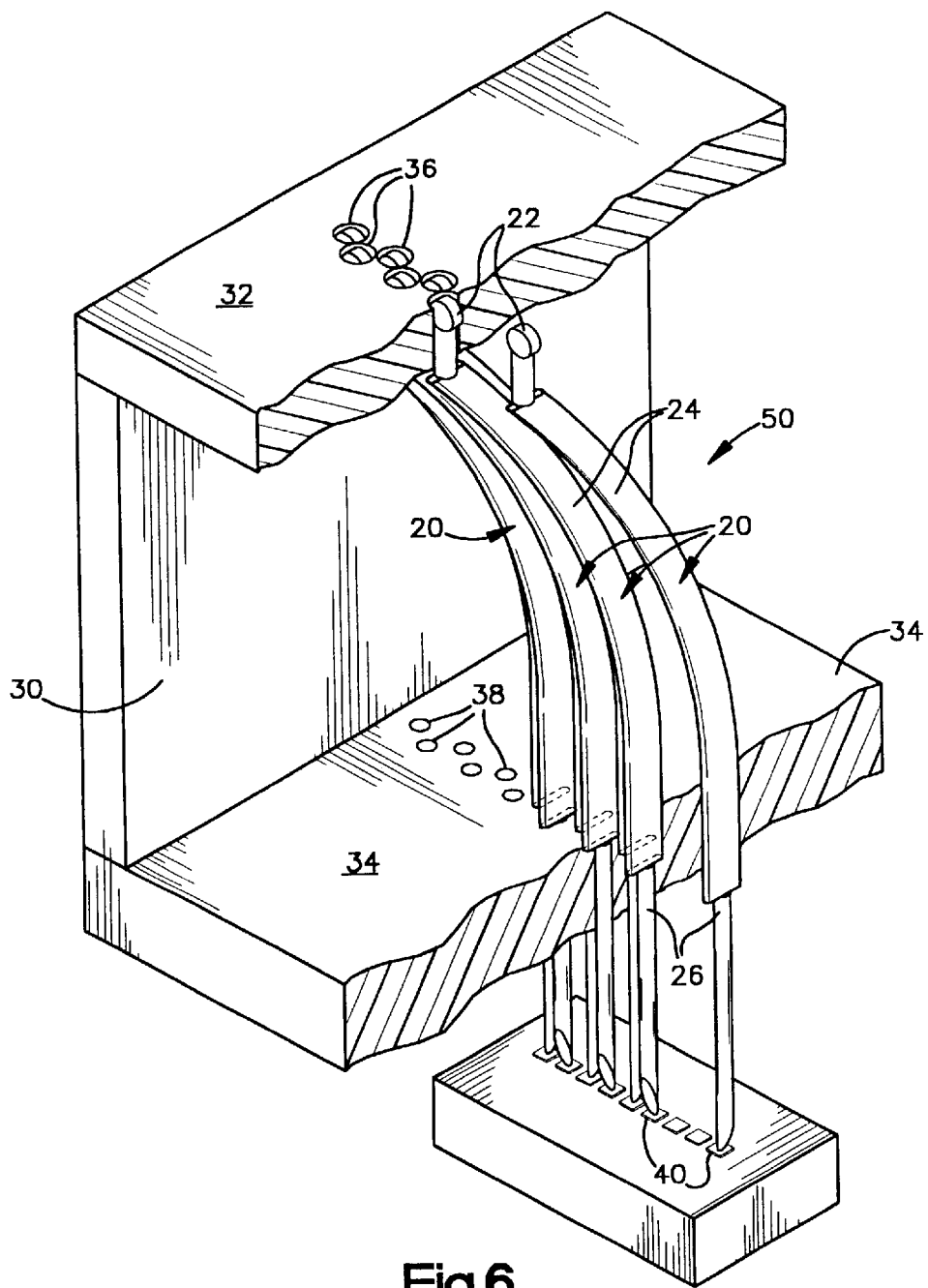
Figure 7:
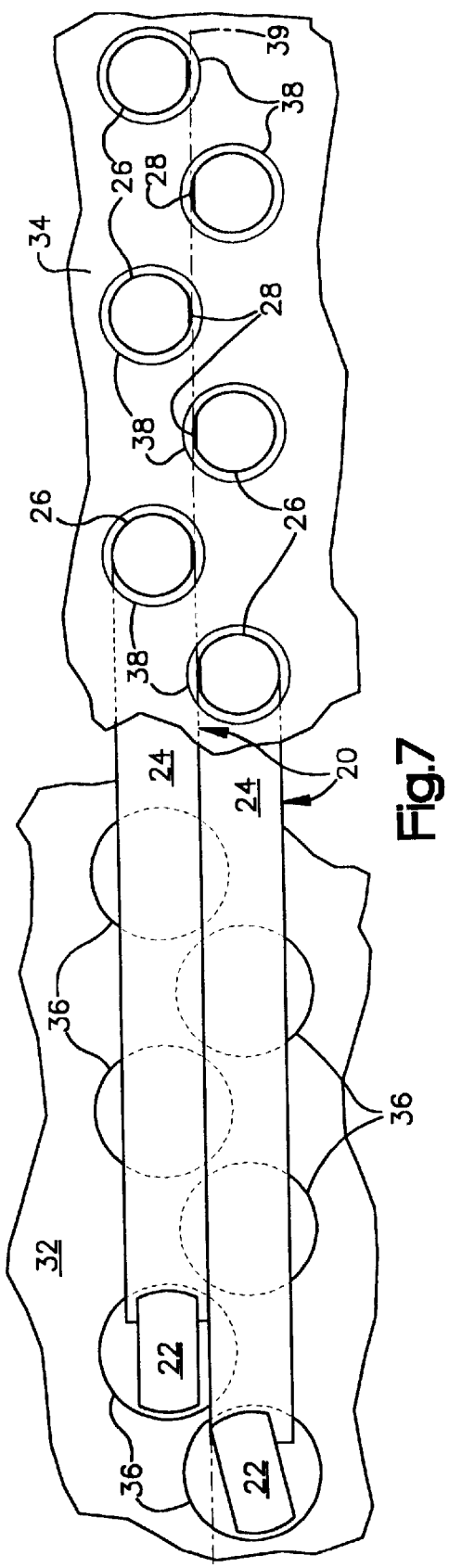

FIGS. 5A and. 5B are a schematic isometric view and a side view, respectively, of a double-bevel offset tip for a probe assembly of the present invention;

FIG. 6 is a schematic isometric view of an alternative embodiment of the multi-DUT probe assembly with the probes arranged in a parallel close pack configuration of the present invention; and FIG. 7 is a bottom view in the direction of 7—7 of the multi-DUT probe assembly in a parallel close pack configuration of the present invention as shown in FIG. 6 (but with only 2 probes shown for clarity).

DETAILED DESCRIPTION OF PREFERRED EMBODIMENTS

Figure 1:
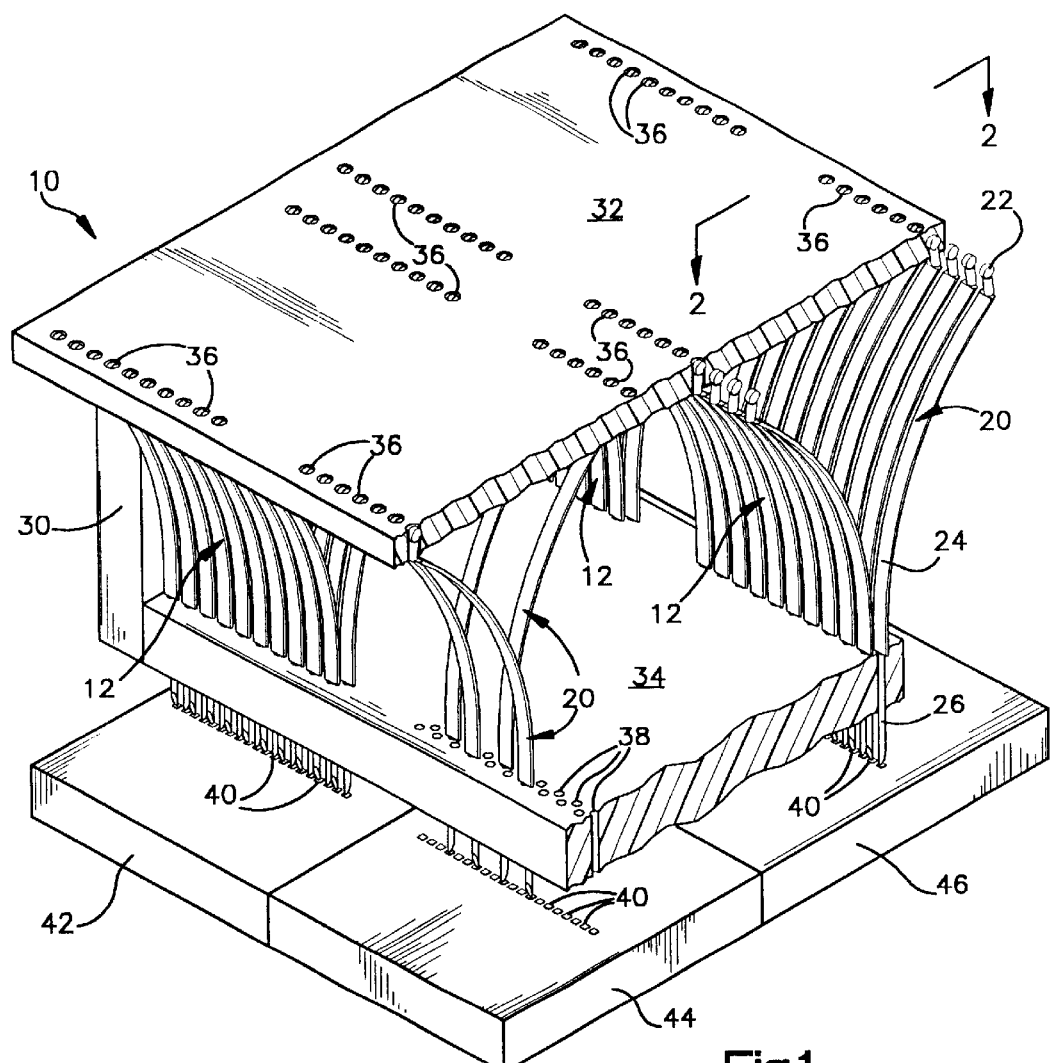
FIG. 1 is a schematic isometric view of a quad multi-DUT probe assembly with the probes arranged in an opposed configuration of the present invention.
Figure 2:
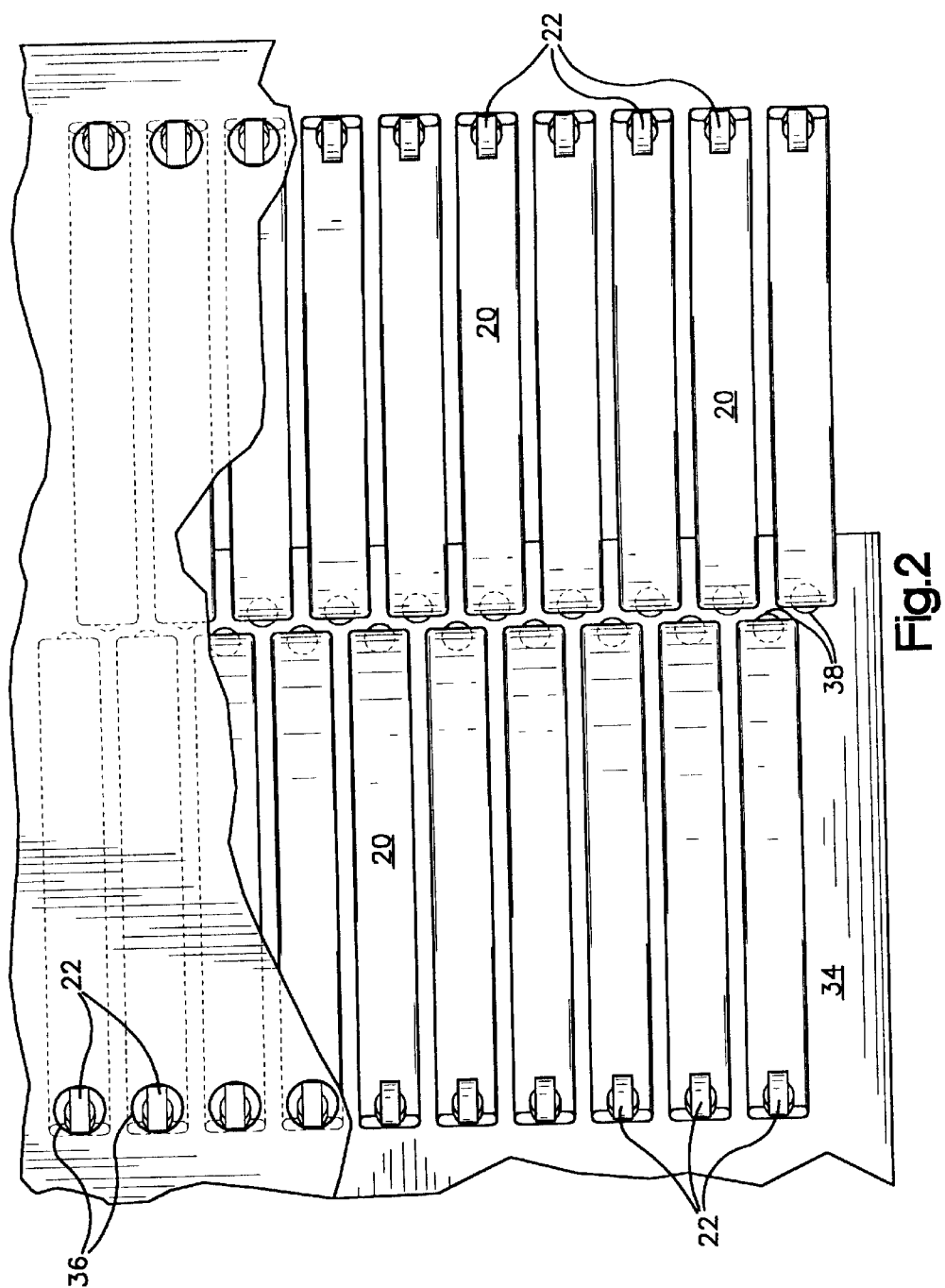
FIG. 2 is a schematic top view of a single multi-DUT probe assembly having a probe arrangement of the present invention as shown in FIG. 1.

Referring now to the drawings, and for the present FIGS. 1 and 2, a schematic representation of a quad multi-DUT (Device under test) probe assembly is shown generally at 10. The multi-DUT probe assembly 10 as illustrated, has four arrays 12 of contact probes 20, but more or less arrays 12 may be utilized to practice the invention. The Multi-DUT probe assembly 10 comprises a housing 30 supporting an upper die 32 and an offset lower die 34. The upper die 32 has upper die holes 36 to mount four arrays 12 of contact probes 20. The lower die 34 has lower die holes 38 to guide the four contact probe arrays 12 into electrical contact with the wire bonding pads 40 of the four devices under test 42, 44, 46 (fourth device not shown). The wire bonding pads 40 are arranged in densely spaced rows in the center of the devices 42, 44, 46 and generally have a center-to-center spacing or pitch on the order of about 150 microns. The wire bonding pads 40 are typically about the size of 100 square microns. Three fully populated Cobra contact arrays 12 are shown contacting the quad-1 device 42, quad-3 device 46 and quad-4 device (not shown) For clarity and illustrative purposes, less than a full array of four Cobra contact probes are shown contacting the quad-2 device 44.

Figure 4A:
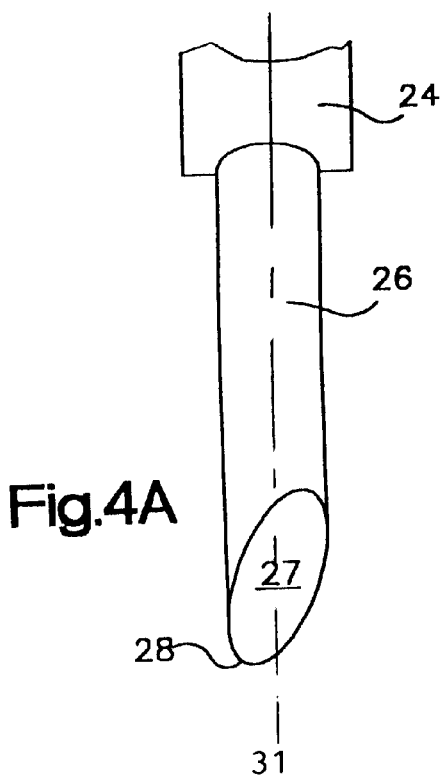
FIGS. 4A and 4B are a schematic isometric view and a side view, respectively, of a single beveled offset tip for a probe assembly of the present invention.
Figure 4B:
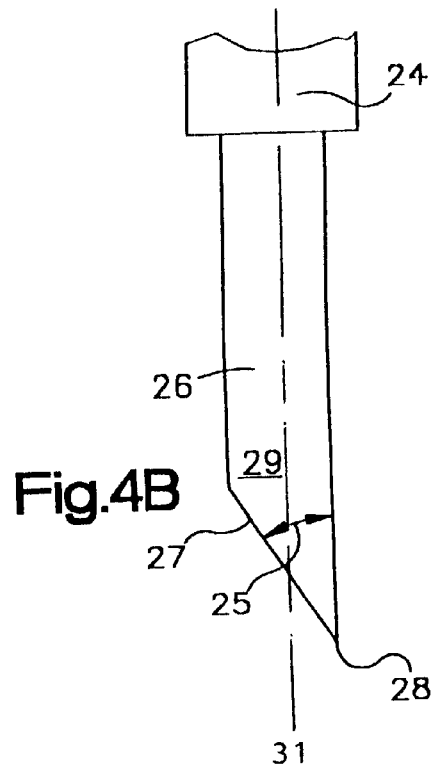

A typical prior art Cobra contact probe 20 is described in U.S. Pat. No. 4,027,935 and is hereby incorporated by reference. The Cobra contact probe 20 may be formed from a single piece of wire having a diameter in the range of about 100 to 125 microns. The contact probe 20 may be made of Paliney-7 material or any other suitable material. The Cobra probe 20 comprises a swaged head 22 pivotally mounted in the hole 36 of the upper die 32, a swaged curved body 24, and a cylindrical shank 26 mounted in the hole 38 of the lower die 34. Since the head 22 is not collinear with its shank 26, the Cobra contact probe 20 when mounted in a probe assembly 10 is constrained such to prevent rotation. The distal end of the cylindrical shank 26 has an inclined surface or bevel 27 forming a tip 28 offset from the center axis 31 (shown in FIGS. 4a and 4b) of the shank 26. The vortex angle 25 of the inclined surface 27 with the probe axis is in the range of about 15 to 45 degrees. It is preferred that the vortex angle 25 be about 30 degrees. Thus the tip 28 may be eccentrically located anywhere between the center axis and the probe periphery 29, and has the advantage of being able to contact pads 40 having an increased spacing or pitch. It is preferred that the tip 28 be located on the circumference of the shank 26.

Figure 3:
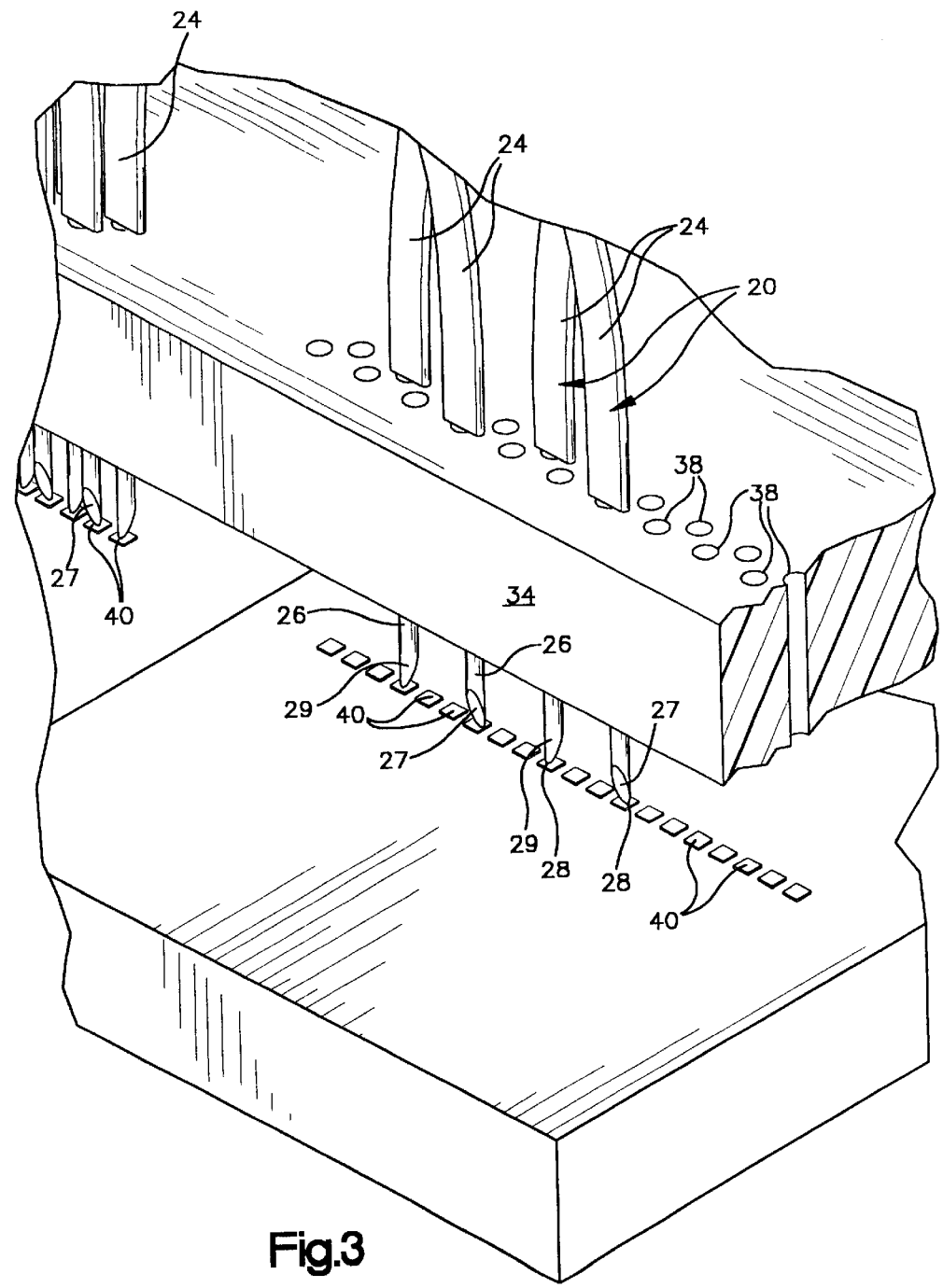
FIG. 3 is a enlarged schematic view of a portion of the single multi-DUT probe assembly having a probe arrangement of the invention as shown in FIG. 1.

As shown in FIG. 2, the present invention provides an array 12 of probes 20 arranged in an opposed configuration 45 to allow for the probing of contact pads 40 having an increased pitch, beyond that which is practical for prior art vertical contact probes. The opposed configuration 45 comprises two parallel rows of upper die holes 36, and a pair of closely spaced, interdigitated rows of lower die holes 38, with the contact probes 20 mounted back-to-back or opposed in the assembly, i.e., the bevel edge 27 of each contact probe 20 faces away from the centerplane 39 of the lower die holes 38, as shown in FIG. 3 and described further, below. The upper die holes 36 are aligned in two parallel and opposed rows where the rows are spaced relatively far apart as compared with the lower die holes 38, in the range of about 10 to 20 diameters apart. The upper die holes 36 in each row are spaced in the range of about one to three diameters apart.

The swaged heads 22 of contact probes 20 are pivotally mounted in each of the upper die holes 36, with the convexly curved probe bodies 24 extending down and into the offset lower die holes 38. The centers of the lower die holes 38 form two closely spaced parallel rows, forming a centerplane 39 there between. The lower die holes 38 are staggered or interdigitated with respect to holes in the opposite row, and are spaced in each row about 1 diameter apart. The centerplane 39 of the lower die holes 38 are located in between the two rows of upper die holes 36 causing each row of probe bodies 24 to curve in a convex manner towards the probes 20 in the opposite row, such that when viewed from the side the probe bodies form a modified V.

As shown in FIG. 3, the probe tips 28 in one row have a 180 degree orientation with respect to the probe tips 28 in the opposite row, such that the bevel surface 27 of each tip 28 face away from the centerplane 39. Thus, all of the probe tips 28 align along the centerplane 39 between the lower die holes 38, such that the bevel surface 27 of each probe 20 face away from the centerplane 39 and are positioned for alignment with the center of the wire bonding pads 40. Of course, probe tips 28 can hit anywhere on pads 40. Furthermore tips 28 do not all have to be arranged along a straight line. Tips 28 can be spaced from center plane 39 a distance depending on the size of pad 40 so that all probes hit pads. To accomplish this spacing, contacts 20 can be spaced from center plane 39 or probe tips 28 can be formed eccentrically located from the probe periphery. Thus the above embodiment of the invention has the advantage over the prior art in that it is possible to contact bonding pads having half the pitch or spacing that were previously possible using conventional Cobra contact probes and configurations (not shown).

An alternative embodiment of the invention is shown in FIGS. 6 and 7, which shows a cutaway view of the probe housing 30 with the probe assembly in a parallel close pack configuration 50. For illustrative purposes and clarity, not all of the probes are shown. The centers of the upper die boles 36 form two closely spaced parallel lines, defining a centerline 37 therebetween. The upper die holes 36 are spaced about a diameter apart, and each upper die hole 36 overlaps the centerline 37 forming a staggered or interdigitated configuration. The upper die holes 36 in each row are closely spaced, allowing only for a small clearance on the order of about 25 microns. The close pack configuration 50 preferably has the center of each upper die hole 36 located equidistant from the centers of the adjacent upper die holes 36 in the opposite row.

The swaged head 22 of a contact probe 20 is pivotally mounted in each of the upper die holes 36, with the curved probe bodies 24 extending down and received into the offset lower die holes 38. All of the contact probes 20 bend in a convex fashion, with each probe body 24 aligned in the same direction and parallel with respect to the other probes. The centers of the lower die holes 38 form two closely spaced parallel rows forming a centerplane 39 therebetween. The lower die holes 38 are staggered with respect to holes in the opposite row and each hole 38 may overlap the centerplane 39 slightly, such that all of the probe tips 28 align along the centerplane 39. Thus, the bevel face 27 of each probe 20 faces away from the centerplane 39 with the tip 28 positioned for alignment with the center of the wire bonding pads 40. The lower die holes 38 are preferably spaced in each row very tightly, allowing only for a minimal clearance on the order of about 1 micron. This parallel close pack configuration 50 is advantageous over prior art configurations because it significantly increases the density of the pads which may be probed.

Although the above embodiments have been described with respect to a cobra contact probe having upper and lower dies, the invention is not limited to cobra contact probes, buckling probes, or other probes having an upper and lower die. For example, vertical probes having an offset tip arranged in either the opposed configuration 45 or the close pack configuration 50 would work for the invention. It is preferred that the probes have a feature which prevents rotation of the tip.

Figure 5B:
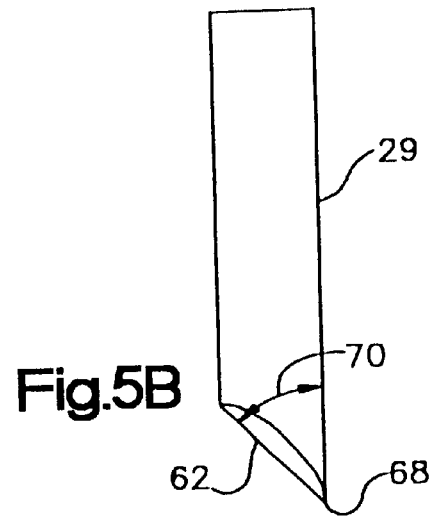

Although the above embodiments have been described with respect to a contact probe comprising a single bevel tip, other probe tip configurations can be utilized such as the conventional pencil tip style probe, wherein the tip of the probe is aligned with the probe center axis. Another embodiment of the probe tip applicable to the above described embodiments, is the double bevel tip which is shown schematically in a perspective view and a side elevational view in FIGS. 5A and 5B, respectively. The double bevel tip probe 60, comprises an inclined edge 62 with a first and second bevel surface (64 and 66) extending from the inclined edge 62 to the periphery 29 of the probe 20. At the apex of the inclined edge 62 a tip 68 is formed. The inclined edge 62 forms an apex angle 70 with the probe center axis. It is preferable that the apex angle 70 be less than about 45 degrees. It is more preferable that the apex angle 70 be about 30 degrees. It is preferred that the probe tip 68 be located on the outermost periphery 29 of the probe 20.

Although the invention has been disclosed and described with respect to certain preferred embodiments, certain variations and modifications may occur to those skilled in the art upon reading this specification. Any such variations and modifications are within the purview of the invention notwithstanding the defining limitations of the accompanying claims and equivalents thereof.

What is claimed is:

1. A probe system, comprising:

a plurality of probes, each said probe terminating in a cylindrical shank, said shank having a center axis and a distal end, the distal end of each said shank having a tip offset from said center axis;

the probes being arranged so that the shanks are aligned in two closely spaced parallel rows whereby each offset tip is adapted to contact one pad to be tested in a row of pads located along a center plane between said two rows;

the offset tip of each shank oriented toward the center plane relative to the center axis of the shank to contact one of said pads; and the system further including means for preventing angular rotation of said shanks.

2. A probe system as in claim 1, wherein each said cylindrical shank has a circumference, and each said shank tip is located along said circumference.

3. A probe system as in claim 1, wherein the probes are arranged to probe pads having a pitch less than about 225 microns.

4. A probe system as in claim 1 wherein the probes are vertical contact probes.

5. A probe system as in claim 1 wherein, each said shank has a bevel surface forming the tip offset from the shank center axis.

6. A probe system for contacting a row of pads comprising:

a housing having a die including a plurality of holes, a plurality of probes, each probe terminating in a shank having a center axis and a circumference, wherein each said shank extends through a hole of said die, each of said shanks having a distal end terminating in a tip for contacting a pad, centers of said die holes with said shanks mounted therein being arranged in two closely spaced parallel interdigitated rows, said pads located beneath the die along a center plane between the centers of said two rows of die holes; and each probe having a curved section for preventing angular rotation of the shank tip.

7. The probe system as in claim 6 wherein the distal end of each of said shanks has a bevel surface forming the tip offset from said center axis.

8. The probe system as in claim 6 wherein said die holes overlap said center plane and centers of said die holes in one row are equidistant from the centers of adjacent die holes in the opposite row.

9. A probe system as in claim 6 wherein said shanks are mounted in a first and second row in said die, each said shank having a tip orientation, said first row of shanks having tips oriented at 180 degrees relative to said tips of said second row of shanks.

10. A probe system as in claim 7 wherein said shank has first and second bevel surfaces intersecting to form a line having an apex, said apex forming a tip.

11. A probe system as in claim 6 wherein each said shank tip is located on said shank circumference.

12. A probe system as in claim 11 wherein said shank tip has a vortex angle less than about 45 degrees.

13. The probe system according to claim 5 wherein the bevel surface of each shank is oriented to face away from said center plane.

14. The probe system according to claim 1 wherein the means to prevent rotation comprises a swaged head on the probe that is not collinear with the shank of the probe.

* * * * *